US011214077B2

(12) United States Patent
Chen et al.

(10) Patent No.: US 11,214,077 B2
(45) Date of Patent: Jan. 4, 2022

(54) MANUFACTURING SYSTEM AND METHOD FOR INKJET PRINTING FLEXIBLE DISPLAY DEVICE

(71) Applicant: HUAZHONG UNIVERSITY OF SCIENCE AND TECHNOLOGY, Hubei (CN)

(72) Inventors: Jiankui Chen, Hubei (CN); Zhouping Yin, Hubei (CN); Yongan Huang, Hubei (CN); Hua Yang, Hubei (CN); Yongqing Duan, Hubei (CN); Yixin Wang, Hubei (CN); Qiangqiang Liu, Hubei (CN); Huayang Li, Hubei (CN); Kaiyou Song, Hubei (CN); Zhilong Shao, Hubei (CN); Zhou Zhang, Hubei (CN); Wen Ou, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/043,710

(22) PCT Filed: May 15, 2020

(86) PCT No.: PCT/CN2020/090592
§ 371 (c)(1),
(2) Date: Sep. 30, 2020

(87) PCT Pub. No.: WO2021/022864
PCT Pub. Date: Feb. 11, 2021

(65) Prior Publication Data
US 2021/0260892 A1    Aug. 26, 2021

(30) Foreign Application Priority Data
Aug. 7, 2019  (CN) .......................... 201910726036.0

(51) Int. Cl.
*B41J 3/407* (2006.01)
*B41M 3/00* (2006.01)
(Continued)

(52) U.S. Cl.
CPC ........... *B41J 3/4073* (2013.01); *B41J 11/002* (2013.01); *B41M 3/006* (2013.01); *C23C 14/14* (2013.01); *C23C 14/34* (2013.01); *B25J 5/005* (2013.01)

(58) Field of Classification Search
CPC ...... B41J 3/4073; B41J 11/002; B41M 3/006; C23C 14/34; C23C 14/14; B25J 5/02; B25J 5/005
See application file for complete search history.

(56) References Cited

U.S. PATENT DOCUMENTS

| | | | |
|---|---|---|---|
| 6,871,596 B2 * | 3/2005 | De-Gol | A63G 1/34 104/53 |
| 2007/0004058 A1 * | 1/2007 | Lee | H01L 21/681 438/14 |

(Continued)

OTHER PUBLICATIONS

"International Search Report (Form PCT/ISA/210) of PCT/CN2020/090592," dated Aug. 20, 2020, pp. 1-6.

*Primary Examiner* — Jennifer Bahls
*Assistant Examiner* — Quang X Nguyen
(74) *Attorney, Agent, or Firm* — JCIP Global Inc.

(57) ABSTRACT

A manufacturing system for an inkjet printing flexible display device includes a substrate input module, a substrate transferring module, a printing module, a post-printing processing module, a solid content detection module, a film packaging printing module, a film formation detection module, a substrate output module. At the same time, the functional modules are highly integrated and optimized in structure and layout. The manufacturing system for the inkjet printing flexible display device is suitable for indus- (Continued)

trial production and are adopted to monitor the manufacturing process by using a plurality of detection modules.

10 Claims, 5 Drawing Sheets

(51) Int. Cl.
*B41J 11/00* (2006.01)
*C23C 14/34* (2006.01)
*C23C 14/14* (2006.01)
*B25J 5/00* (2006.01)

(56) References Cited

U.S. PATENT DOCUMENTS

| | | | |
|---|---|---|---|
| 2012/0210934 A1* | 8/2012 | Nakamura | B41J 11/0015 |
| | | | 118/708 |
| 2019/0103559 A1* | 4/2019 | Lee | H01L 51/0012 |
| 2019/0134824 A1* | 5/2019 | Seavey | B62D 57/024 |

* cited by examiner

MANUFACTURING SYSTEM AND METHOD FOR INKJET PRINTING FLEXIBLE DISPLAY DEVICE

CROSS-REFERENCE TO RELATED APPLICATION

This application is a 371 of international application of PCT application serial no. PCT/CN2020/090592, filed on May 15, 2020, which claims the priority benefit of China application no. 201910726036.0, filed on Aug. 7, 2019. The entirety of each of the above mentioned patent applications is hereby incorporated by reference herein and made a part of this specification.

BACKGROUND

Technical Field

The disclosure relates to the technical field of flexible display device manufacturing, and more specifically relates to a manufacturing system and a method for an inkjet printing flexible display device.

Description of Related Art

The flexible display device is a deformable and bendable display device made of a flexible substrate material, which may be applied to various application fields such as curved screens and foldable mobile device display screens. Compared with the traditional vacuum thermal evaporation process, the inkjet printing process has become one of the main development trends of flexible display device manufacturing in the future due to characteristics such as high production efficiency, low equipment requirements, and low material loss rate. However, the current relevant inkjet printing manufacturing equipment are mostly applied to the field of laboratory research, which still has a long way to go before the real industrial-grade production application.

Specifically, in the actual industrial-grade production application, since the flexible display device has higher requirements for ink material deposition pattern and quality, many new challenges are presented to the existing inkjet printing manufacturing equipment. Firstly, in the industrial-grade production application, there are high requirements for the yield rate of flexible display device manufacturing. As for the inkjet printing manufacturing process, the quality of the flexible display device is affected by process factors of multiple stages such as jet printing, drying, and baking. An issue at any stage may cause irreparable defects on the final device, thereby reducing the yield rate of flexible display device manufacturing. Secondly, the industrial-grade production application requires high-volume and fast manufacturing. Therefore, there are also high requirements for the degree of automation of the process and the system for inkjet printing manufacturing, which require a high-speed and highly automated production process. Thirdly, the industrial-grade production requires strict monitoring of all stages and equipment in the production process, so that issues can be discovered and resolved in time, so as to avoid delay in the entire manufacturing system or resulting in quality issue of the final flexible display device due to an error at a certain stage.

Through the search for novelty, it can be known that part of the process and the system for manufacturing the inkjet printing flexible display device has been provided in the prior art, such as Chinese publication no. CN1994741A and other early patents. However, during the process of actual use, the following technical issues are encountered. Firstly, since the inkjet manufacturing process of the flexible display device involves multiple stages and different processes, there is a lack of an overall structural system for ink printing manufacturing that is suitable for industrial-scale production and meets the actual process requirements. Secondly, the existing system for manufacturing the inkjet printing flexible display device is also insufficiently integrated. The multiple stages involved during the production process cannot be operated flexibly and conveniently in the system. Therefore, the flexible display device needs to be switched between multiple systems during the manufacturing process, which seriously affects the efficiency of the production process and the quality stability of the device. Finally, during the inkjet printing manufacturing process of the flexible display device, the multiple stages of the manufacturing system lack corresponding monitoring and detection modules, and the functional configuration and working manner of the monitoring and detection modules are insufficiently researched. Therefore, once an issue occurs, it is difficult for the issue to be found in time, thereby greatly affecting the yield rate of device manufacturing.

SUMMARY

In view of the defects and improvement requirements of the prior art, the objective of the disclosure is to provide a system and a method for manufacturing an inkjet printing flexible display device. The overall structure and spatial layout of the complex manufacturing system are redesigned, and the specific structures and configuration manners of multiple key components such as a printing module, multiple monitoring and detection modules, and a substrate transferring module are optimized, which may correspondingly implement a fully automatic production process and highly integrated arrayed processes such as inkjet printing, vacuum drying, heat baking, and ultraviolet (UV) curing while cooperating with a substrate transporting and transferring module to greatly improve the production efficiency and implement the comprehensive and accurate monitoring of the key stages and equipment statuses during the entire manufacturing process. Therefore, the system and the method are especially suitable for high-quality and high-efficiency industrialized manufacturing of the modernized flexible display device.

Correspondingly, according to an aspect of the disclosure, a manufacturing system for an inkjet printing flexible display device is provided. The system includes a substrate input module, a substrate transferring module, a printing module, a post-printing processing module, a solid content detection module, a film packaging printing module, a film formation detection module, and a substrate output module.

The substrate input module is disposed at a front end of the entire manufacturing system, and is configured to pre-process a substrate as a printing material to be transported into the printing module.

The substrate transferring module is located in a central region of the entire manufacturing system and has multiple substrate handling manipulators and an annular track. The printing module, the post-printing processing module, the solid content detection module, the film packaging printing module and the film formation detection module are arranged along the circumferential direction of the annular track, so that according to different working requirements, the substrate handling manipulators are adopted to perform directional movement on the annular track, thereby implementing the handling and transfer of the substrate between the functional modules.

The printing module includes a first Y-axis movement unit, a first X-axis movement unit, a first printhead unit, a first printhead top-view detection unit, a first substrate bottom-view detection unit, a first flying ink drop observation unit, and a printing automated optical inspection (AOI) detection unit. The first Y-axis movement unit is configured to implement the movement of the first printhead unit in the horizontal direction as the Y-axis direction. The first X-axis movement unit is configured to implement the movement of the substrate in the vertical direction as the X-axis direction. The first printhead unit is equipped with a movement component in the upright direction as, the Z-axis direction, and is configured to execute patterned deposition of an ink material functional layer on the surface of the substrate after reaching a predetermined position. In addition, the first printhead top-view detection unit is configured for real-time detection of the surface cleanliness and position angle of the printhead of the first printhead unit. The first substrate bottom-view detection unit is configured for real-time detection of the position of the substrate. The first flying ink drop observation unit is configured to observe the state of ink drops ejected by the first printhead unit and calibrate a drive waveform. The printing AOI detection unit is configured to execute scanning and imaging on the substrate after the patterned deposition is completed while using a collected image to detect various printing defects.

The post-printing processing module is configured for vacuum drying, baking, and curing processing on the substrate after patterned deposition transferred here. The solid content detection module includes a film surface sputtering equipment and a film surface detection equipment. The film surface sputtering equipment is configured to sputter a metallic-coated layer on a designated region of the substrate transferred here and send the substrate to the film surface detection equipment to detect morphological characteristics of the ink material functional layer before and after the metallic-coated layer.

The film packaging printing module is configured to continue printing and film formation of a film packaging ink material on the surface of the substrate transferred here. The film formation detection module is kept connected with the film packaging printing module and is configured to detect whether there is a quality defect on the surface of the substrate after the film packaging.

The substrate output module is disposed at a back end of the entire manufacturing system and includes a first substrate rotating component, a first linear movement component, a first substrate fixture, and a first air floating conveying platform. The first substrate rotating component is configured to firstly adjust the movement direction of the substrate transferred here. The first air floating conveying platform suspends the substrate above the surface of the platform with the help of airflow. The first substrate fixture clamps the substrate. The substrate is finally output from the manufacturing system through a reciprocating movement of the first linear movement component.

As further preferred, the substrate input module preferably includes a second air floating conveying platform, a second linear movement component, a second substrate fixture, and a second substrate rotating component. The second air floating conveying platform suspends the substrate above a platform surface with the help of airflow. The second substrate fixture clamps the substrate. The transportation movement of the substrate is implemented through the reciprocating movement of the second linear movement component. The second substrate rotating component is configured to modulate the movement direction of the substrate to ensure that the substrate enters the printing module.

As further preferred, the post-printing processing module preferably includes a vacuum drying chamber, a baking hotplate, and a curing chamber, so that the substrate entered here is sequentially processed by vacuum drying, baking, and curing.

As further preferred, the film packaging printing module includes a second Y-axis movement unit, a second X-axis movement unit, a second printhead unit, a second printhead top-view detection unit, a second substrate bottom-view detection unit, and a second flying ink drop observation unit. The second Y-axis movement unit is configured to implement the movement of the second printhead unit in the horizontal direction as the Y-axis direction. The second X-axis movement unit is configured to implement the movement of the substrate in the vertical direction as the X-axis direction. The second printhead unit is configured to print and film form the film packaging ink material on the surface of the substrate. In addition, the second printhead top-view detection unit is configured for real-time detection of the surface cleanliness and position angle of the printhead of the second printhead unit. The second substrate bottom-view detection unit is configured for real-time detection of the position of the substrate. The second flying ink drop observation unit is configured to observe the state of ink drops ejected by the second printhead unit and calibrate a drive waveform.

As further preferred, the first printhead unit in the printing module is preferably an overall module structure composed of multiple modules with the same structure. Each module includes a base-plate component, a back-plate component, a front-plate component, a top-plate component, a left sealing plate component, a right sealing plate component, and a printhead accessory. The base-plate component is located at the lower part of the module and serves as the installation basis for other components. The back-plate component is located at the back part of the module and is configured to install an external electric/pneumatic interface while implementing the clamping/relaxing operation of the printhead. The front-plate component is located at the front part of the module and is configured to install a structure that enables the printhead to move in the Z-axis direction and a matching stabilizing structure. The top-plate component is located on the upper part of the module and is provided with a liquid inlet and a handle for filling ink and fetching the module. The left sealing plate component and the right sealing plate component are respectively located on the left and right sides of the module to form an enclosed structure together with other sealing plate components, and are provided with heat-dissipating fans. The printhead accessory is configured to provide ink/gas, etc. to a printhead and is installed inside the enclosed structure together with printheads connected thereto.

As further preferred, the first printhead top-view detection unit in the printing module preferably includes a top-view high-power vision component, a top-view low-power vision component, and a lens protection component. The top-view low-power vision component is installed near the first flying ink drop observation unit and is configured to align with the position of the printhead for large-field-of-view low-precision visual detection. The top-view high-power vision component is installed near the first X-axis movement unit and is configured to align with the position of the printhead for small-field-of-view high-precision visual detection. The lens protection component is installed above the lenses of the top-view high-power vision component and the top-view low-power vision component, and is configured to prevent ink from polluting the lenses.

As further preferred, the first substrate bottom-view detection unit in the printing module preferably includes a bottom-view vision module base, and a bottom-view high-power vision component and a bottom-view low-power vision component respectively installed thereon. When positioning the substrate, the bottom-view low-power vision component is firstly used for large-field-of-view coarse positioning. After the positioning point is found, the bottom-view high-power vision component is then used for small-field-of-view precise positioning.

As further preferred, the first flying ink drop observation unit in the printing module preferably includes two vision components and a control board. Each vision component includes an industrial camera, a lens, a stroboscopic light source, and a reflector for transmitting light from the stroboscopic light source to the lens. In addition, the two vision components are arranged at an included angle α of less than or equal to 90°. An intersection point of two light paths of the vision components after passing through the reflector is located directly below a certain orifice of the printhead. The principle of binocular vision is adopted to collect 3D images of ink drops. The control board is configured to control a lag time of a trigger signal of each of the industrial cameras and each of the stroboscopic light sources relative to an ignition signal of the printhead, so that the image collection starts when the ink drops enter the observation position.

As further preferred, the first flying ink drop observation unit is preferably movable along multiple axial directions, so as to implement the observation of ink drops at different orifice positions of the printhead.

As further preferred, the printing AOI detection unit in the printing module preferably includes multiple of the same image collection components. Each image collection component includes an industrial camera, a lens, a coaxial light source, and a vision unit base. All the image collection components are connected as a whole through the vision unit bases and are distributed at equal intervals along a direction. At the same time, the scanning movement of the entire printing AOI detection unit in the Y-axis direction relative to the substrate is implemented under the driving of the first Y-axis movement unit, so that the collected images are used to detect various printing defects after the scanning and imaging of the substrate are completed.

According to another aspect of the disclosure, a corresponding method for manufacturing the inkjet printing flexible display device is also provided. The method includes the following steps.

Step S1 is the preprocessing and input of the substrate.

The substrate as the printing material is preprocessed, and then transported into the printing module through the substrate input module.

Step S2 is the printing and relevant monitoring of the functional layer of the substrate.

After the substrate enters the printing module, real-time detection and corresponding calibration of the position of the substrate are first executed through the first substrate bottom-view detection unit. Then, the surface cleanliness and position angle of the printhead of the first printhead unit are detected and processed through the first printhead top-view detection unit. The ink drops ejected by the first printhead unit are observed and the corresponding drive waveform is calibrated through the first flying ink drop observation unit.

After passing all the above detection, the first printhead unit and the substrate are respectively driven by the first Y-axis movement unit and the first X-axis movement unit to complete the patterned deposition of the ink material functional layer at a specified position of the substrate.

After completing the patterned deposition, the substrate is scanned and imaged through the printing AOI detection unit while the collected images are used to detect various printing defects.

Step S3 is the transfer and sputtering processing of the substrate.

The substrate transferring module fetches the substrate from the printing module, and then transfers the substrate into the post-printing processing module to sequentially execute vacuum drying, baking, and curing processing.

The substrate transferring module continues to transfer the substrate into the solid content detection module. The metallic-coated layer is sputtered to the specified position of the substrate through the film surface sputtering equipment while the morphological characteristics of the ink material functional layer after the metallic-coated layer are detected through the film surface detection equipment.

Step S4 is the transfer and packaging processing of the substrate.

The substrate transferring module fetches the substrate from the solid content detection module, and then transfers the substrate into the film packaging printing module. The printing and film formation of the film packaging ink material are continued to be executed on the substrate.

The substrate transferring module continues to transfer the substrate into the post-printing processing module to execute film curing processing.

The substrate transferring module continues to transfer the substrate to the film formation detection module to detect whether there is a quality defect on the film packaging.

The substrate transferring module finally transfers the substrate to the substrate output module. The substrate output module implements smooth output.

In general, compared with the prior art, the above technical solutions conceived by the disclosure mainly have the following technical advantages.

1. The overall structure and spatial layout of the complex manufacturing system are redesigned, and the specific structures and configuration manners of multiple key components such as the printing module, the multiple monitoring and detection modules, and the substrate transferring module are optimized, which can correspondingly implement the fully automatic production in a compact and easy-to-operate way. The previously separated processes such as printing, vacuum drying, heat baking, and curing are used in cooperation with the substrate transporting and transferring modules to implement the full process coverage of inkjet printing manufacturing of the flexible display device. Also, the required modules are highly integrated into the same manufacturing system, which correspondingly saves space while greatly improving the production efficiency and production stability.

2. The disclosure further respectively provides corresponding multiple detection modules after the inkjet printing process, the substrate post-processing process, and the film packaging process are completed, which can correspondingly implement the real-time online automatic detection of substrate printing quality, cured film morphology characteristics, packaging device film parameters, etc. As such, it is convenient to detect the occurrence of defective products to be eliminated through detection after the important process stages, so as to improve the yield rate. Also, the time spent on detection during the traditional manufacturing process can be significantly reduced through the optimized design of the specific arrangement and mutual cooperation thereof, so as to improve the manufacturing efficiency.

3. In the disclosure, the printing module, which is the core part of the manufacturing system for the inkjet printing flexible display device, is specifically optimized. The substrate, printhead, and flying droplet are respectively and automatically detected. Online detection may be performed on important parameters such as placement position of the substrate, installation error of the printhead, surface cleanliness of the printhead, and parameters of ejected drops.

When an issue is found, the adjustment of corresponding process parameters may be implemented in cooperation with the corresponding printhead module and movement module to increase the stability of the inkjet printing manufacturing process, so as to effectively improve the yield rate of production.

4. In the disclosure, the substrate transportation method of the substrate input module adopts the form of the air floating conveying platform to carry the substrate while the substrate fixture driven by a linear motor module implements the transportation of the substrate, which effectively improves the flatness of the substrate.

5. In the disclosure, the printhead module in the printing module also adopts a modular design scheme, which can implement rapid replacement between different printhead modules. On the one hand, the printing module can adapt to the process requirements, such as changes in ink materials, of multiple functional layers of the flexible display device. On the other hand, the replacement time of printhead modules is also sped up and the system downtime due to printhead maintenance and other conditions is reduced, so as to improve the production efficiency.

6. The disclosure has also performed process optimization design for multiple key process stages. Correspondingly, compared with the existing process flow, the provided complete inkjet printing flexible display device processing technology can ensure the quality of the device while reducing the waste of time caused by switching between different processes. Therefore, the manufacturing quality and manufacturing efficiency can be significantly improved.

DETAILED DESCRIPTION OF DISCLOSED EMBODIMENTS

For the objective, technical solutions, and advantages of the disclosure to be clearer, the disclosure is further described in detail below with reference to the accompanying drawings and the embodiments. It should be understood that the specific embodiments described here are only used to explain the disclosure, but not to limit the disclosure. In addition, the technical features involved in the various embodiments of the disclosure described below may be combined with each other as long as there is no conflict therebetween.

Figure 1:
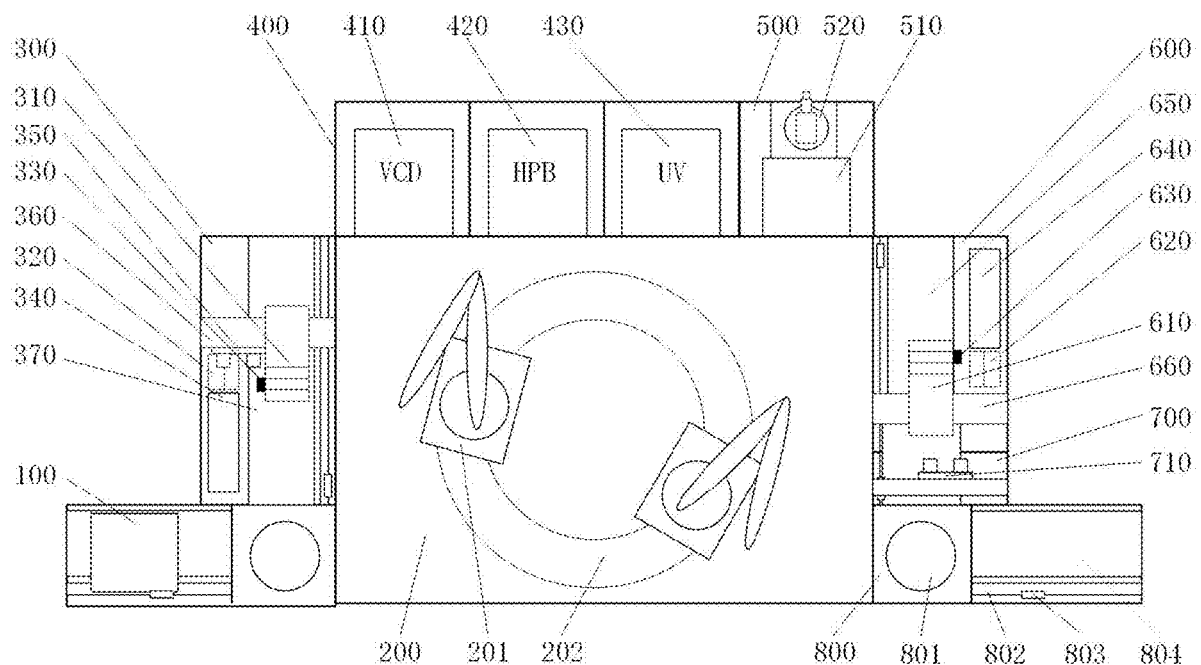
FIG. 1 is a schematic diagram of an overall structure and layout of a manufacturing system for an inkjet printing flexible display device constructed according to the disclosure.
Figure 2:
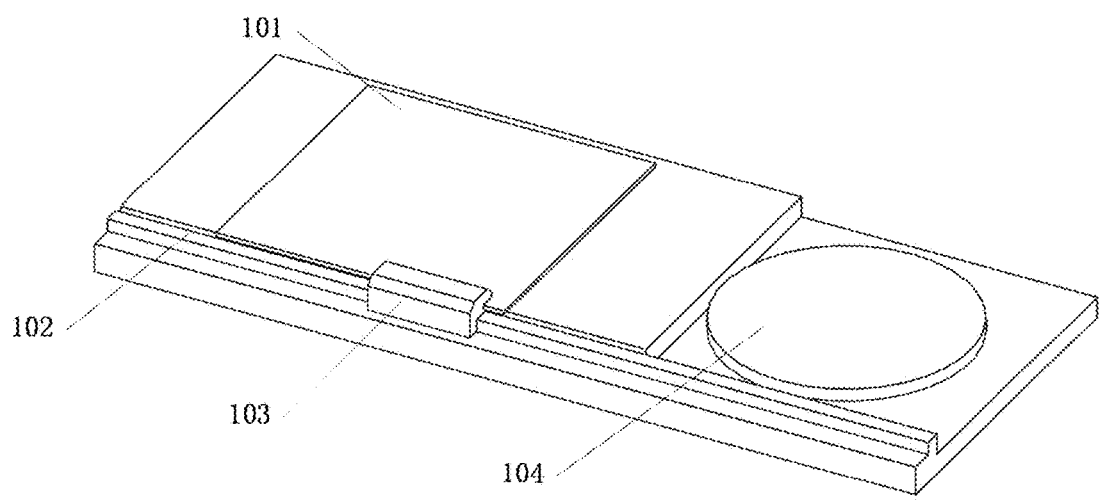
FIG. 2 is a schematic structural diagram of a substrate input module according to a preferred embodiment of the disclosure.

As shown in FIG. 1, a manufacturing system for an inkjet printing flexible display device provided by an embodiment of the disclosure mainly includes a substrate input module 100, a substrate transferring module 200, a printing module 300, a post-printing processing module 400, a solid content detection module 500, a film packaging printing module 600, a film formation detection module 700, and a substrate output module 800. The substrate input module 100 is responsible for transporting the substrate into the manufacturing system for the inkjet printing flexible display device. The substrate transferring module 200 may transfer the substrate between multiple modules through substrate handling manipulators. The printing module 300, the post-printing processing module 400, the solid content detection module 500, and the film packaging printing module 600 are sequentially distributed around the substrate transferring module 200. The printing module 300 may implement the patterned deposition of multiple ink material functional layers of the flexible display device. After the deposition, the substrate transferring module 200 transfers the substrate to the post-printing processing module 400, the solid content detection module 500, the curing module, etc. for subsequent processing and detection. After the deposition of all functional layers is completed, the substrate is transferred to the film packaging printing module 600 for film packaging. The flexible display device is detected through the film formation detection module 700. Finally, the substrate is transported out of the system by the substrate output module 800 placed at the end of the system.

Each module will be explained and described in detail below.

The substrate input module 100 is placed at a front end of the entire inkjet printing manufacturing system and is responsible for transporting the substrate into the manufacturing system for the inkjet printing flexible display device.

More specifically, according to a preferred embodiment of the disclosure, the substrate input module 100 may include a second air floating conveying platform 101, a second linear movement component 102, a second substrate fixture 103, and a second substrate rotating component 104. The second air floating conveying platform 101 suspends the substrate above the surface of the platform with the help of airflow. The second substrate fixture 103 clamps the substrate. The transportation movement of the substrate is implemented through the reciprocating movement of the second linear movement component 102. The second substrate rotating component 104 is configured to modulate the movement direction of the substrate to ensure that the substrate enters the printing module 300.

The substrate transferring module 200 is placed at a center position of the entire printing manufacturing system and includes multiple substrate handling manipulators 201 and an annular track 202. The substrate handling manipulators 201 may move on the annular track 202 to transfer the substrate between multiple modules. Different substrate handling manipulators 201 may adapt to handling requirements of different environmental conditions.

The printing module 300 preferably includes a first printhead unit 310, a first printhead top-view detection unit 320, a first substrate bottom-view detection unit 330, a first flying ink drop observation unit 340, a first printing automated optical inspection (AOI) detection unit 350, a first Y-axis movement unit 360, and a first X-axis movement unit 370. More specifically, the first printhead unit 310 implements the printing and deposition of ink material on the substrate. The first printhead top-view detection unit 320, the first substrate bottom-view detection unit 330, the first flying ink drop observation unit 340, and the first printing AOI detection unit 350 implement the detection of equipment status and process inside the printing module 300. The first Y-axis movement unit 360 implements the detection and printing movement of the first printhead unit 310 in the Y-axis direction. The first X-axis movement unit 370 implements the detection and printing movement of the substrate in the X-axis direction. The entire module is mainly configured for the printing manufacturing of the functional layer of the flexible display device.

The post-printing processing module 400 may, for example, include a vacuum drying chamber 410, a baking hotplate 420 and a curing chamber 430, which may implement process operations such as vacuum drying, baking, and curing on the printed substrate.

The solid content detection module 500, for example, includes a film surface sputtering equipment 510 and a film surface detection equipment 520. The film surface sputtering equipment 510 sputters a metallic-coated layer on the film surface at a specified position of the substrate to be sent to the film surface detection equipment 520 for detection, so as to obtain the morphological features of the functional layer after the metallic-coated layer.

The film packaging printing module 600 preferably includes a second printhead unit 610, a second printhead top-view detection unit 620, a second substrate bottom-view detection unit 630, a second flying ink drop observation unit 640, a second X-axis movement unit 650 and a second Y-axis movement unit 660. More specifically, the second printhead unit 610 implements the printing and film formation of a film packaging ink material above the substrate. The second printhead top-view detection unit 620, the second substrate bottom-view detection unit 630 and the second flying ink drop observation unit 640 respectively implement the equipment status and process detection inside the film packaging printing module 600. In addition, the second X-axis movement unit 650 implements the detection and printing movement of the substrate in the X-axis direction. The second Y-axis movement unit 660 implements the detection and printing movement of the second printhead unit 610 in the Y-axis direction. The entire module is mainly configured for the printing manufacturing of a packaging film layer of the flexible display device.

The film formation detection module 700 is connected with the film packaging printing module 600 to implement the transmission of the flexible display device and may, for example, include a cured film AOI detection unit 710 for detecting whether there is a defect on the film after packaging.

In addition, the substrate output module 800 is placed at a back end of the entire printing manufacturing system. According to a preferred embodiment of the disclosure, the substrate output module 800 may include a first substrate rotating unit 801, a first linear movement unit 802 driven by a linear motor, a first substrate fixture 803 and a first air floating conveying platform 804. The module adjusts the movement direction of the substrate after packaging and AOI detection through the first substrate rotating unit 801, and transports the substrate carried on the first air floating conveying platform 804 away from the manufacturing system for the inkjet printing flexible display device using the first substrate fixture 803 installed on the first linear movement unit 802.

Figure 3:
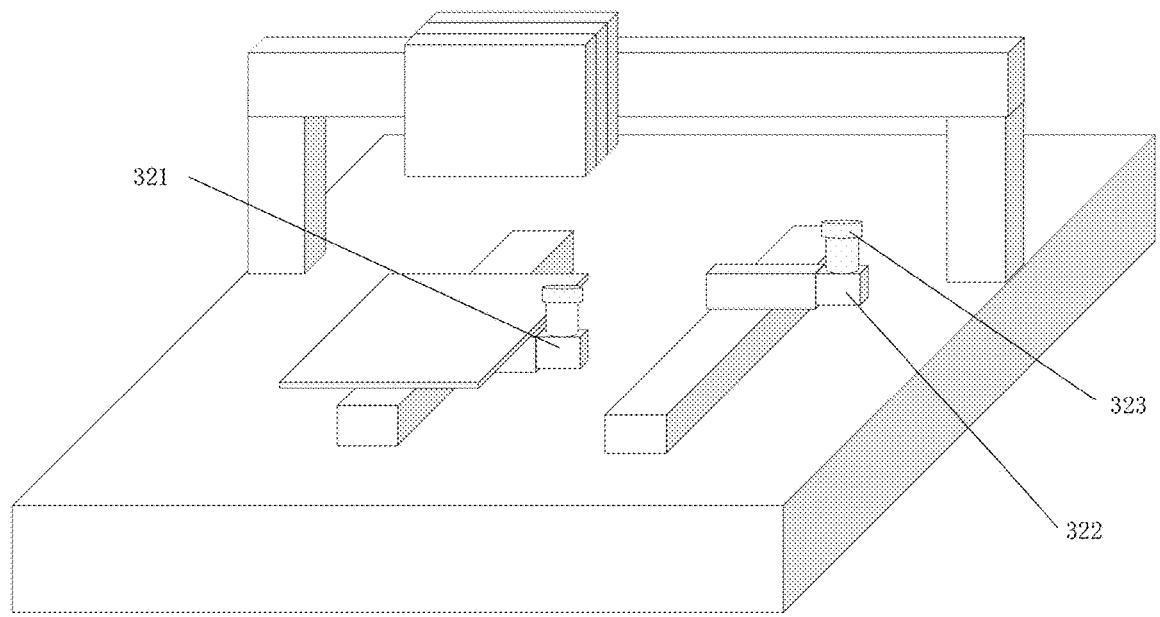
FIG. 3 is a schematic diagram for an exemplary description of detection of a printhead by a printhead top-view detection unit.

According to another preferred embodiment of the disclosure, as shown in FIG. 3, the first printhead top-view detection unit 320 includes a top-view high-power vision component 321, a top-view low-power vision component 322 and a lens protection component 323. The top-view low-power vision component 322 is installed next to the first flying ink drop observation unit 340, and the first Y-axis movement unit 360 implements the movement of the first printhead unit 310, so that the top-view low-power vision component 322 is aligned with the position of the printhead for large-field-of-view low-precision visual detection. The top-view high-power vision component 321 is installed next to the first X-axis movement unit 370, and the first Y-axis movement unit 360 implements the movement of the first printhead unit 310, so that the top-view high-power vision component 321 is aligned with the position of the printhead for small-field-of-view high-precision visual detection. The lens protection component 323 is installed above the lenses of the top-view high-power vision component 321 and the top-view low-power vision component 322 to prevent ink from polluting the lenses. In this way, the first printhead top-view detection unit 320 is configured to observe the cleanliness of the printhead, detect the positioning mark at the bottom part of the printhead module, and sample to detect the position of the orifice, so as to implement functions such as identifying ink stains on the bottom surface of the printhead and calculating the position and angle of the printhead.

Figure 4:
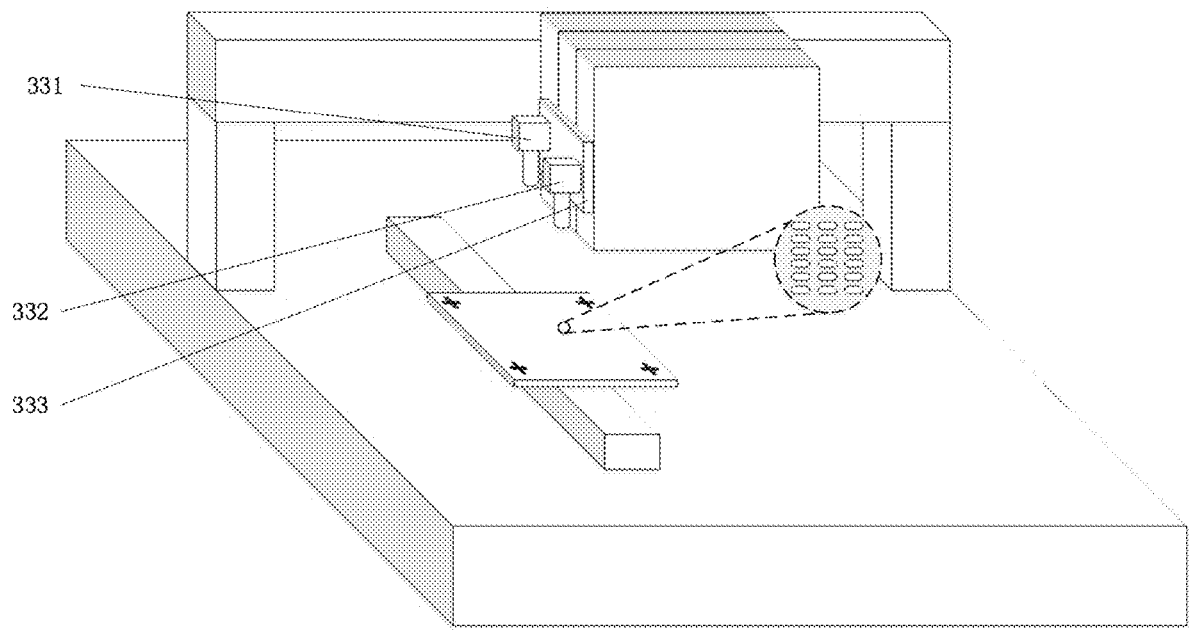
FIG. 4 is a schematic diagram for an exemplary description of detection of a substrate by a substrate bottom-view detection unit.

According to another preferred embodiment of the disclosure, as shown in FIG. 4, the first substrate bottom-view detection unit 330 may include a bottom-view high-power vision component 331, a bottom-view low-power vision component 332 and a bottom-view vision module base 333. The bottom-view high-power vision component 331 and the bottom-view low-power vision component 332 are installed on the bottom-view vision module base 333. The bottom-view vision module base 333 is installed next to the first printhead unit 310, and the first Y-axis movement unit 360 and the first X-axis movement unit 370 implement actions such as adjusting the observation position of the first bottom-view detection unit 330, so that the corresponding detection position of the substrate is adjusted to the best observation region of the vision module.

More specifically, when detecting the position of the substrate, the bottom-view low-power vision component 332 is first used for large-field-of-view coarse positioning. After the positioning point is found, the bottom-view high-power vision component 332 is then used for small-field-of-view precise positioning. At the same time, the height direction of the two vision modules should ensure that 2 cameras can focus at the same time, and the horizontal distance should ensure that the two do not interfere. During detection, the substrate and the first substrate bottom-view detection unit 330 move under the drive of the X-axis and Y-axis movement units. The substrate is scanned to detect the positioning marks at the four corners of the substrate and the ink drop position.

Figure 5:
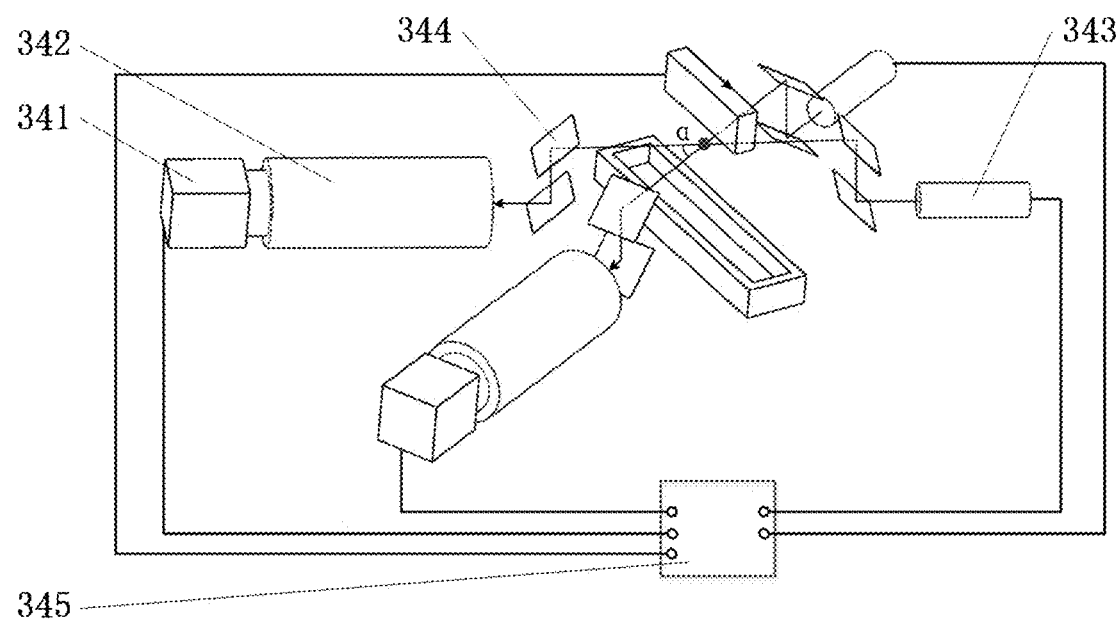
FIG. 5 is a schematic diagram for an exemplary description of detection of ink drops ejected by a printhead by a flying ink drop detection unit.

According to yet another preferred embodiment of the disclosure, as shown in FIG. 5, the first flying ink drop observation unit 340 may include two vision modules and a control board 345. Each vision module includes an industrial camera 341, a lens 342, a stroboscopic light source 343, and a reflector 344 for transmitting light from the stroboscopic light source to the lens. The two vision modules are arranged at a specific included angle α. An intersection point of light paths thereof after passing through the reflector 344 is located directly below a certain orifice of the printhead. The principle of binocular vision is adopted to collect 3D images of ink drops. The control board 345 is configured to control a lag time of trigger signals of two industrial cameras 341 and two stroboscopic light sources 343 relative to an ignition signal of the printhead, so that the image collection starts when the ink drops enter the observation position. The ink drop observation system is installed on the X-axis movement module 370 of the printing module 300 and may move along multiple axes, so as to implement the observation of ink drops at different orifice positions of the printhead.

Figure 6:
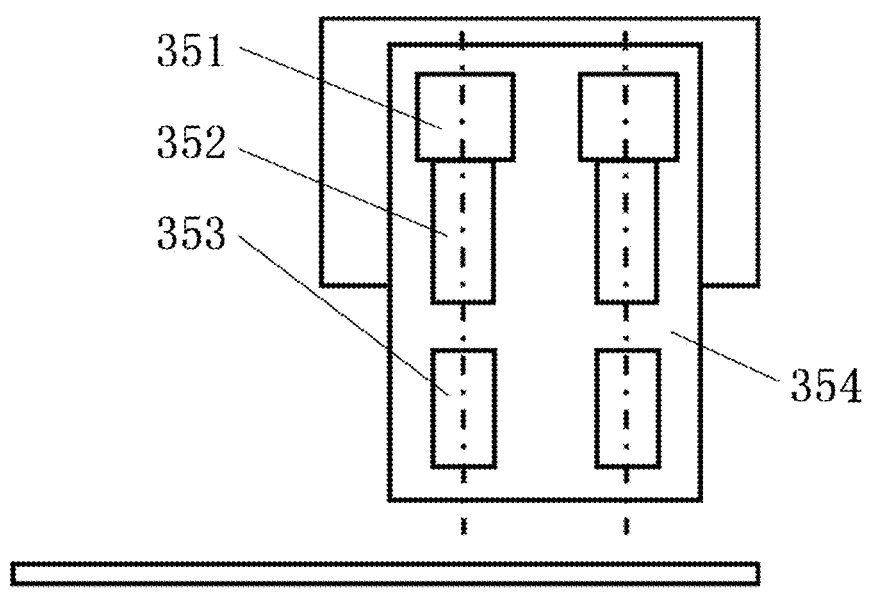
FIG. 6 is a schematic diagram for an exemplary description of detection of a printing result by an automated optical inspection (AOI) detection unit.

According to yet another preferred embodiment of the disclosure, as shown in FIG. 6, the printing AOI detection unit 350 includes multiple of the same image collection components. Each image collection component includes a high-resolution industrial camera 351, a camera lens 352, a coaxial light source 353, and a vision unit base 354. All the image collection units are connected as a whole through the vision unit base 354, are distributed at equal intervals along a direction, are installed next to the first printhead unit 310, and are driven by the first Y-axis movement unit 360 to implement the Y-direction scanning movement of the substrate by the 350. At the same time, the substrate is driven by the first X-axis movement unit 370 to implement the X-direction scanning movement of the substrate by the 350. After the scanning and imaging of the substrate are completed, the collected images are used to detect the scattered dots, missing spray, pixel connection, and other defects during the printing process.

Figure 7:
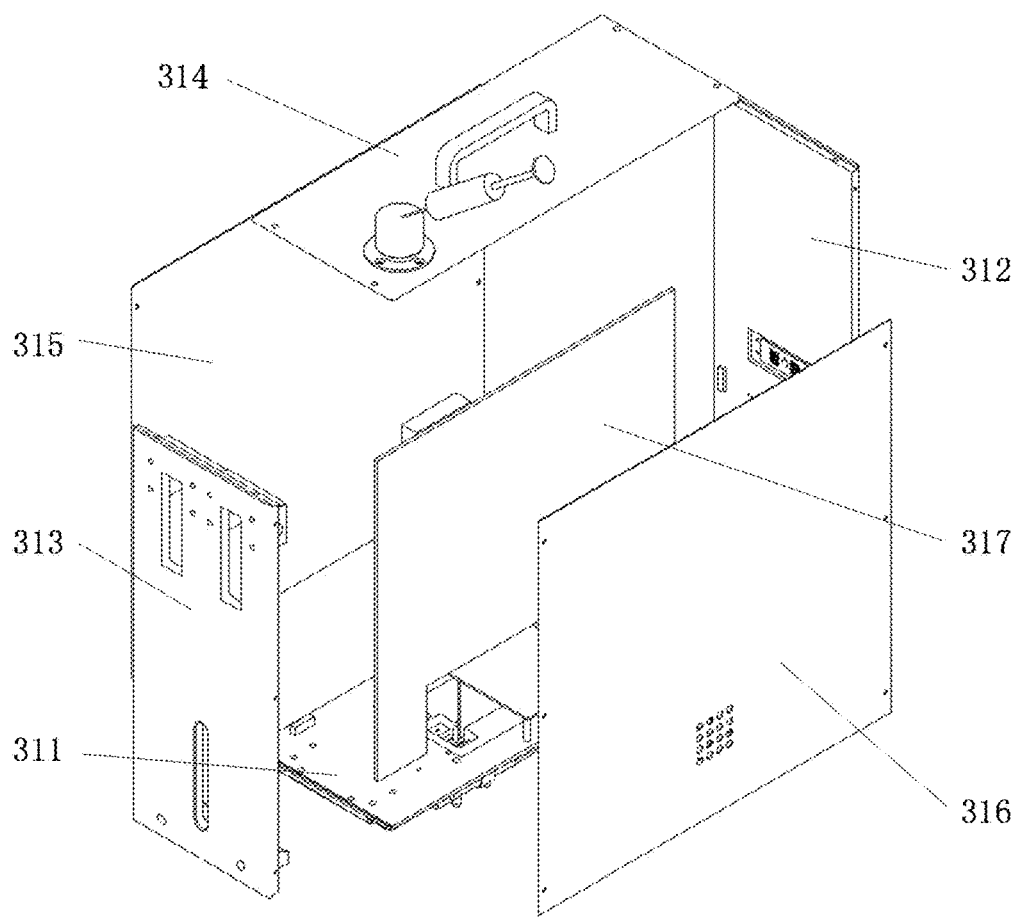
FIG. 7 is a schematic structural diagram of a printhead module according to a preferred embodiment of the disclosure.

According to yet another preferred embodiment of the disclosure, as shown in FIG. 7, the first printhead unit 310 may be composed of multiple of the same printhead components. The mechanical structure of each of the printhead components includes a base-plate component 311, a back-plate component 312, a front-plate component 313, a top-plate component 314, a left sealing plate component 315, a right sealing plate component 316 and a printhead accessory 317. The components are connected to form an overall module structure. The base-plate component 311 is located at the lower part of the printhead device and is configured for the installation and adjustment of other components and the precise positioning of printhead device placement and the precise installation of the printhead. The back-plate assembly 312 is located at the back part of the printhead device and is configured for the installation of an external electrical/pneumatic interface for the printhead device. When installing/removing the printhead device, the back-plate assembly 312 automatically and quickly connects with the external electrical/pneumatic interface and implements the horizontal X-direction movement of the printhead device and the clamping and relaxing of the printhead device. The front-plate component 313 is located at the front end of the printhead device. The component is provided with a structure for the upright Z-direction movement of the printhead device and a stabilizing structure for the vertical movement of the printhead device to prevent the printhead device from being misplaced and collided due to shaking. The top-plate component 314 is located on the upper part of the printhead device and is provided with a liquid inlet and a handle for filling ink and fetching the module. The left sealing plate component 315 and the right sealing plate component 316 are respectively installed on the left and right sides of the printhead device, so that the device becomes an enclosed module, and are disposed with heat-dissipating fans for heat dissipation of various parts of the printhead device. The printhead accessory 317 supplies ink/air, etc. for the printhead and is installed inside the printhead device.

Figure 8:
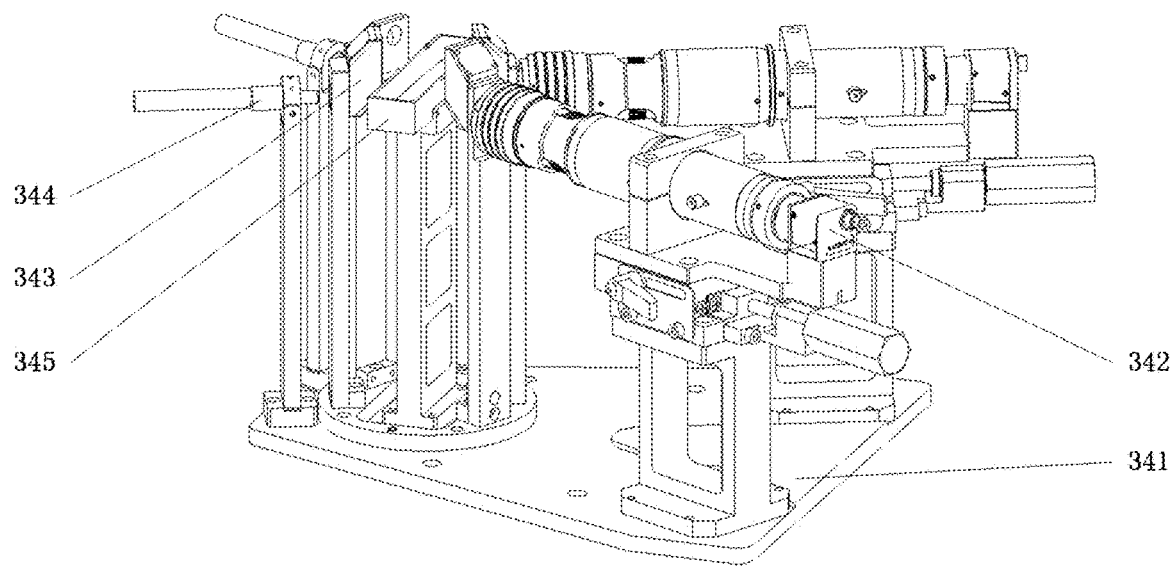
FIG. 8 is a schematic structural diagram of a flying ink drop detection unit according to a preferred embodiment of the disclosure.

As shown in FIG. 8, the mechanical structure of the first flying ink drop detection unit 340 may mainly include a supporting base-plate, a charge-coupled device (CCD) vision component, a dual-reflective lens unit, a light-emitting diode (LED) light source component, a waste liquid gathering unit, and a control system. Flying ink drops are objects in flight and to be observed by the device, which have different sizes, fast flying speeds, and diverse shapes. A flying distance H in the upright Z-direction is very small and is less than a radius D/2 of the camera lens, that is, H<D/2. The supporting base-plate is configured to install the unit modules of the device and determine the included angle α of a binocular camera. The CCD vision component and the LED light source component form two monocular vision units. The two monocular vision units have the same structural design and are fixed on the supporting base-plate. The two monocular vision units form the included angle α to form the binocular vision unit. The included angle α is the angle for implementing binocular camera observation, and a is greater than the minimum angle that does not cause the interference of the binocular camera unit and is ≤90°. The dual-reflective lens unit is located between the CCD vision component and the LED light source component, and is configured to change the spatial state of light path propagation. The waste liquid gathering unit below is configured to gather ink drops. The control system may implement synchronous image collection and observation of the binocular camera.

Figure 9:
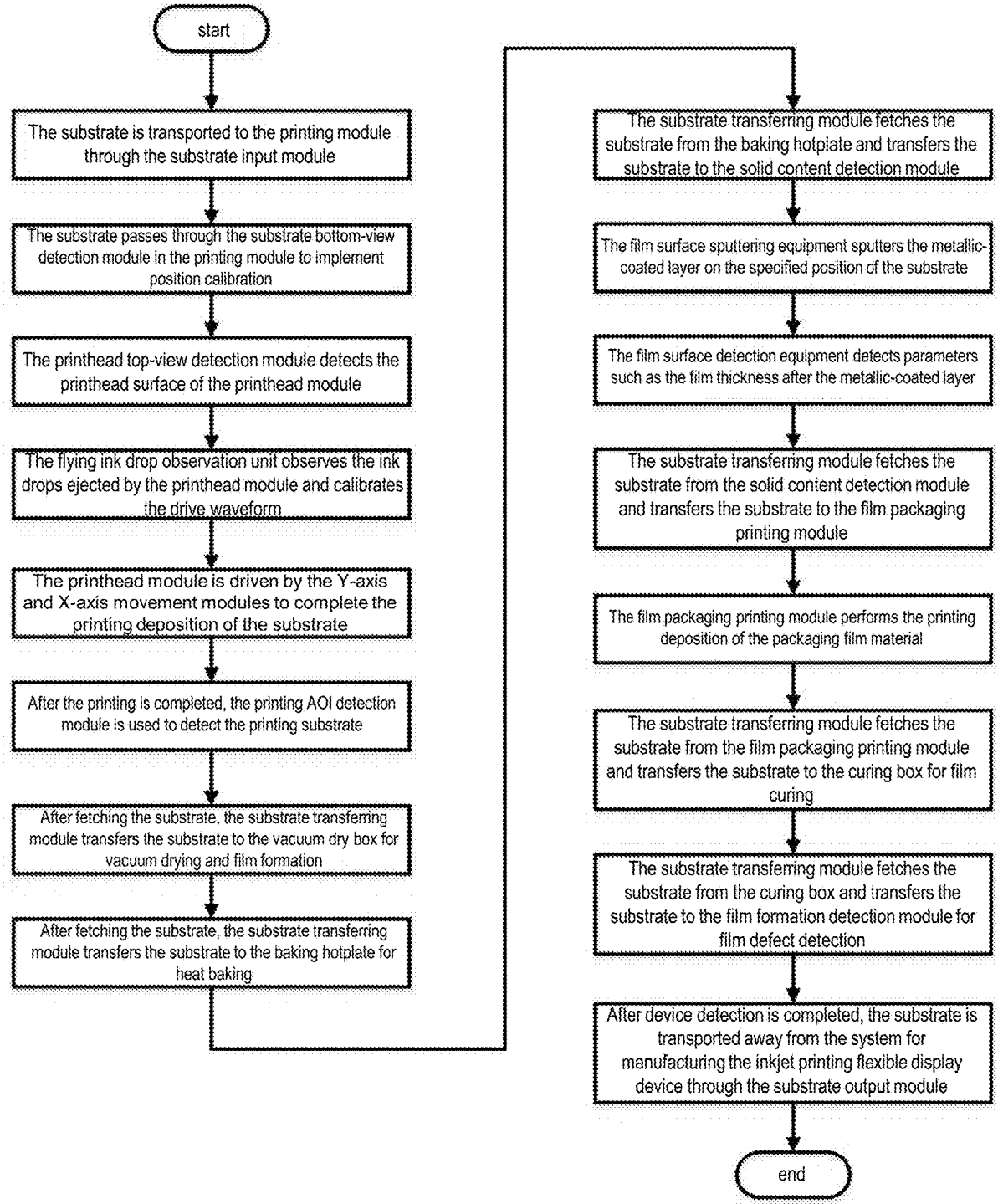
FIG. 9 is a general flow chart of a manufacturing process of an inkjet printing flexible display device constructed according to the disclosure.

As shown in FIG. 9, the disclosure also provides a method for manufacturing an inkjet printing flexible display device, which adopts the flexible electronic manufacturing system according to the embodiment of the disclosure for manufacturing. The method may specifically include the following steps.

1) The substrate is transported into the printing module 300 through the substrate input module 100 after preprocessing.

2) The position of the substrate inside the printing module 300 is calibrated through the first substrate bottom-view detection unit 330.

3) The first printhead top-view detection unit 320 detects the surface cleanliness and position of the printhead of the first printhead unit 310.

4) The first flying ink drop observation unit 340 observes the ink drops ejected by the first printhead unit 310 and calibrates the drive waveform.

5) After passing all detection, the first printhead unit 310 and the substrate are driven by the first Y-axis movement unit 360 and the first X-axis movement unit 370 to complete the printing deposition of the ink material at the specified position of the substrate.

6) After printing is completed, the printing AOI detection unit 350 is used to detect the printed substrate.

7) The substrate transferring module 200 fetches the substrate from the printing module 300 and transfers the substrate to the vacuum drying chamber 410 of the post-printing processing module 400 for vacuum drying and film formation.

8) After the substrate transferring module 200 fetches the substrate from the vacuum drying chamber 410, the substrate is put into the baking hotplate 420 for heating and baking to improve the film performance.

9) The substrate transferring module 200 fetches the substrate from the baking hotplate 420 and transfers the substrate into the solid content detection module 500.

10) The film surface sputtering equipment 510 sputters the metallic-coated layer on the specified position of the substrate.

11) The film surface detection device 520 detects parameters such as the film thickness after the metallic-coated layer.

12) After passing detection, the substrate transferring module 200 fetches the substrate from the solid content detection module 500 and transfers the substrate to the film packaging printing module 600.

13) The film packaging printing module 600 performs printing deposition of a packaging film material.

4) The substrate transferring module 200 fetches the substrate from the film packaging printing module 600 and transfers the substrate to the curing chamber 430 for film curing.

15) The substrate transferring module 200 fetches the substrate from the curing chamber 430 and transfers the substrate to the film formation detection module 700 for film defect detection.

16) After device detection is completed, the substrate is transported away from the manufacturing system for the inkjet printing flexible display device through the substrate output module 800.

The above steps only describe the whole process of preparing the flexible display device on different modules in the inkjet printing manufacturing system. The actual process may be that multiple modules in the system operate at the same time and repeatedly in cycles to effectively improve the production efficiency.

In the disclosure, only the inkjet printing manufacturing processes of certain typical functional layers are listed. However, the flexible display device is a multilayer film structure with multiple functional layers, such as a light-emitting layer, a hole injection layer, and an electron transport layer. The functional layers only need to replace the printing ink materials and printing parameters to print, which has no influence on the process flow and system of the disclosure.

Persons skilled in the art may easily understand that the above descriptions are only preferred embodiments of the disclosure and are not intended to limit the disclosure. Any modification, equivalent replacement, improvement, etc. made within the spirit and principle of the disclosure should be included in the protection scope of the disclosure.

What is claimed is:

1. A manufacturing system for an inkjet printing flexible display device, the manufacturing system comprising a substrate input module, a substrate transferring module, a printing module, a post-printing processing module, a solid content detection module, a film packaging printing module, a film formation detection module, and a substrate output module, wherein the substrate input module is disposed at a front end of the entire manufacturing system, and is configured to pre-process a substrate as a printing material to be transported into the printing module;

the substrate transferring module is located in a central region of the entire manufacturing system and has a plurality of substrate handling manipulators and an annular track, and the printing module, the post-printing processing module, the solid content detection module, the film packaging printing module, and the film formation detection module are arranged along a circumferential direction of the annular track, so that according to different working requirements, the substrate handling manipulators is adopted to perform directional movement on the annular track, thereby implementing handling and transfer of the substrate between the functional modules;

the printing module comprises a first Y-axis movement unit, a first X-axis movement unit, a first printhead unit, a first printhead top-view detection unit, a first substrate bottom-view detection unit, a first flying ink drop observation unit, and a printing automated optical inspection (AOI) detection unit, wherein the first Y-axis movement unit is configured to implement movement of the first printhead unit in a horizontal direction as a Y-axis direction, and the first X-axis movement unit is configured to implement movement of the substrate in a vertical direction as an X-axis direction; the first printhead unit is equipped with a movement component in an upright direction as a Z-axis direction, and is configured to execute patterned deposition of an ink material functional layer on a surface of the substrate after reaching a predetermined position; the first printhead top-view detection unit is configured for real-time detection of surface cleanliness and position angle of a printhead of the first printhead unit, and the first substrate bottom-view detection unit is configured for real-time detection of a position of the substrate; and the first flying ink drop observation unit is configured to observe a state of ink drops ejected by the first printhead unit and calibrate a drive waveform, the printing AOI detection unit is configured to execute scanning and imaging on the substrate after the patterned deposition is completed while using a collected image to detect a printing defect;

the post-printing processing module is configured for vacuum drying, baking, and curing processing on the substrate transferred after the patterned deposition; and the solid content detection module comprises a film surface sputtering equipment and a film surface detection equipment, wherein the film surface sputtering equipment is configured to sputter a metallic-coated layer on a designated region of the transferred substrate and send the substrate to the film surface detection equipment to detect morphological characteristics of the ink material functional layer before and after the metallic-coated layer;

the film packaging printing module is configured to continue printing and film formation of a film packaging ink material on the surface of the transferred substrate transferred; and the film formation detection module is kept connected with the film packaging printing module and is configured to detect whether there is a quality defect on the surface of the substrate after film packaging; and the substrate output module is disposed at a back end of the entire manufacturing system and comprises a first substrate rotating component, a first linear movement component, a first substrate fixture, and a first air floating conveying platform, wherein the first substrate rotating component is configured to firstly adjust a movement direction of the transferred substrate, the first air floating conveying platform suspends the substrate above a platform surface using airflow; and the first substrate fixture clamps the substrate, and the substrate is finally output from the manufacturing system through a reciprocating movement of the first linear movement component.

2. The manufacturing system for the inkjet printing flexible display device according to claim 1, wherein the substrate input module comprises a second air floating conveying platform, a second linear movement component, a second substrate fixture, and a second substrate rotating component, wherein the second air floating conveying platform suspends the substrate above a platform surface using airflow, the second substrate fixture clamps the substrate, a transportation movement of the substrate is implemented through a reciprocating movement of the second linear movement component; and the second substrate rotating component is configured to modulate the movement direction of the substrate to ensure that the substrate enters the printing module.

3. The manufacturing system for the inkjet printing flexible display device according to claim 1, wherein the film packaging printing module comprises a second Y-axis movement unit, a second X-axis movement unit, a second printhead unit, a second printhead top-view detection unit, a second substrate bottom-view detection unit and a second flying ink drop observation unit, wherein the second Y-axis movement unit is configured to implement movement of the second printhead unit in the horizontal direction as the Y-axis direction, and the second X-axis movement unit is configured to implement the movement of the substrate in the vertical direction as the X-axis direction; the second printhead unit is configured to print and film form the film packaging ink material on the surface of the substrate; the second printhead top-view detection unit is configured for real-time detection of surface cleanliness and position angle of a printhead of the second printhead unit, and the second substrate bottom-view detection unit is configured for real-time detection of the position of the substrate; and the second flying ink drop observation unit is configured to observe a state of ink drops ejected by the second printhead unit and calibrate the drive waveform.

4. The manufacturing system for the inkjet printing flexible display device according to claim 1, wherein the first printhead unit in the printing module is an overall module structure composed of a plurality of modules with a same structure, and each of the modules comprises a base-plate component, a back-plate component, a front-plate component, a top-plate component, a left sealing plate component, a right sealing plate component and a printhead accessory, wherein the base-plate component (311) is located at a lower part of the module and serves as an installation basis for other components; the back-plate component is located at a back part of the module and is configured to install an external electric/pneumatic interface while implementing a clamping/relaxing operation of the printhead; the front-plate component is located at a front part of the module and is configured to install a structure that enables the printhead to move in the Z-axis direction and a matching stabilizing structure; the top-plate component is located on an upper part of the module and is provided with a liquid inlet and a handle for filling ink and fetching the module; the left sealing plate component and the right sealing plate component are respectively located on left and right sides of the module to form an enclosed structure together with other sealing plate components, and are provided with heat-dissipating fans; and the printhead accessory is configured to provide ink/gas to a printhead and is installed inside the enclosed structure together with printheads connected thereto.

5. The manufacturing system for the inkjet printing flexible display device according to claim 1, wherein the first printhead top-view detection unit in the printing module comprises a top-view high-power vision component, a top-view low-power vision component and a lens protection component, wherein the top-view low-power vision component is installed near the first flying ink drop observation unit and is configured to align with a position of the printhead for large-field-of-view low-precision visual detection; the top-view high-power vision component is installed near the first X-axis movement unit and is configured to align with the position of the printhead for small-field-of-view high-precision visual detection; and the lens protection component is installed above lenses of the top-view high-power vision component and the top-view low-power vision component, and is configured to prevent ink from polluting the lenses.

6. The manufacturing system for the inkjet printing flexible display device according to claim 1, wherein the first substrate bottom-view detection unit in the printing module comprises a bottom-view vision module base, and a bottom-view high-power vision component and a bottom-view low-power vision component respectively installed thereon, wherein when positioning the substrate, the bottom-view low-power vision component is firstly used for large-field-of-view coarse positioning, and after a positioning point is found, the bottom-view high-power vision component is then used for small-field-of-view precise positioning.

7. The manufacturing system for the inkjet printing flexible display device according to claim 1, wherein the first flying ink drop observation unit in the printing module comprises two vision components and a control board, wherein each of the vision components comprises an industrial camera, a lens, a stroboscopic light source and a reflector for transmitting light from the stroboscopic light source to the lens; the two vision components are arranged at an included angle $\alpha$ of less than or equal to 90°, an intersection point of two light paths of the vision components after passing through the reflector is located directly below a certain orifice of the printhead, and a principle of binocular vision is adopted to collect 3D images of ink drops; and the control board is configured to control a lag time of a trigger signal of each of the industrial cameras and each of the stroboscopic light sources relative to an ignition signal of the printhead, so that image collection starts when the ink drops enter an observation position.

8. The manufacturing system for the inkjet printing flexible display device according to claim 1, wherein the first flying ink drop observation unit is movable along a plurality of axial directions, so as to implement observation of ink drops at different orifice positions of the printhead.

9. The manufacturing system for the inkjet printing flexible display device according to claim 1, wherein the printing AOI detection unit in the printing module comprises a plurality of image collection components, and each of the image collection components comprises an industrial camera, a lens, a coaxial light source and a vision unit base, wherein all of the image collection components are connected as a whole through the vision unit bases and are distributed at equal intervals along a direction, at the same time, a scanning movement of the entire printing AOI detection unit in the Y-axis direction relative to the substrate is implemented under driving of the first Y-axis movement unit, so that a collected image is used to detect a printing defect after scanning and imaging of the substrate are completed.

10. A method for manufacturing an inkjet printing flexible display device, wherein the method is executed based on the system according to claim 1, the method comprising:

step S1: preprocessing and inputting the substrate wherein the step S1 includes preprocessing the substrate as the printing material, and then transporting the substrate into the printing module through the substrate input module;

step S2: printing and relevant monitoring a functional layer of the substrate wherein the step S2 includes firstly executing real-time detection and corresponding calibration of the position of the substrate through the first substrate bottom-view detection unit after the substrate enters the printing module, then detecting and processing the surface cleanliness and the position angle of the printhead of the first printhead unit through the first printhead top-view detection unit, and observing the ink drops ejected by the first printhead unit and calibrating the corresponding drive waveform through the first flying ink drop observation unit;

completing the patterned deposition of the ink material functional layer at a specified position of the substrate by the first printhead unit and the substrate respectively driven by the first Y-axis movement unit and the first X-axis movement unit after passing all of the above detection; and scanning and imaging the substrate through the printing AOI detection unit while detecting the printing defect using the collected image after completing the patterned deposition;

step S3: transferring and sputtering the substrate wherein the step S3 includes fetching the substrate from the printing module by the substrate transferring module, and then transferring the substrate into the post-printing processing module to sequentially execute vacuum drying, baking, and curing processing; and continue transferring the substrate into the solid content detection module by the substrate transferring module, sputtering the metallic-coated layer to the specified position of the substrate through the film surface sputtering equipment while detecting the morphological characteristics of the ink material functional layer after the metallic-coated layer through the film surface detection equipment; and step S4: transferring and packaging the substrate wherein the step S4 includes fetching the substrate from the solid content detection module by the substrate transferring module, and then transferring the substrate into the film packaging printing module, and continue executing printing and film formation of the film packaging ink material on the substrate;

continue transferring the substrate to the post-printing processing module by the substrate transferring module to execute film curing processing;

continue transferring the substrate to the film formation detection module by the substrate transferring module to detect whether there is the quality defect on the film packaging; and finally transferring the substrate to the substrate output module by the substrate transferring module, and implementing smooth output by the substrate output module.

* * * * *